(12) United States Patent
Weisbecker et al.

(10) Patent No.: US 12,553,830 B2
(45) Date of Patent: Feb. 17, 2026

(54) FLUORESCENT INK AND IMAGING SYSTEM FOR DEFECT DETECTION ON PRINTED PHOTOSENSITIVE OBJECTS

(71) Applicant: Sun Chemical Corporation, Parsippany, NJ (US)

(72) Inventors: Carl Weisbecker, Carlstadt, NJ (US); Mohammad S. Farahat, Carlstadt, NJ (US); Erika Rebrosova, St. Charles, IL (US); Srikanth Yanamanagandla, Carlstadt, NJ (US)

(73) Assignee: Sun Chemical Corporation, Parsippany, NJ (US)

( * ) Notice: Subject to any disclaimer, the term of this patent is extended or adjusted under 35 U.S.C. 154(b) by 0 days.

(21) Appl. No.: 19/109,517

(22) PCT Filed: Jan. 24, 2024

(86) PCT No.: PCT/US2024/012812
§ 371 (c)(1),
(2) Date: Mar. 6, 2025

(87) PCT Pub. No.: WO2024/158935
PCT Pub. Date: Aug. 2, 2024

(65) Prior Publication Data
US 2025/0258099 A1    Aug. 14, 2025

Related U.S. Application Data

(60) Provisional application No. 63/441,198, filed on Jan. 26, 2023.

(51) Int. Cl.
*G01N 21/64* (2006.01)
*B41M 3/06* (2006.01)
(Continued)

(52) U.S. Cl.
CPC .......... *G01N 21/6456* (2013.01); *B41M 3/06* (2013.01); *C09D 11/50* (2013.01); *C09D 11/52* (2013.01);
(Continued)

(58) Field of Classification Search
None
See application file for complete search history.

(56) References Cited

U.S. PATENT DOCUMENTS

| 4,331,871 | A | * | 5/1982 | Allinikov | ............... | G01N 21/91 |
| | | | | | | 250/302 |
| 5,525,516 | A | | 6/1996 | Krutak | | |

(Continued)

FOREIGN PATENT DOCUMENTS

| CA | 2721010 A1 | 5/2012 |
| DE | 102007059683 A1 | 6/2009 |

(Continued)

OTHER PUBLICATIONS

International Search Report issued in International Application No. PCT/US2024/012812, mailed Jun. 6, 2024.

(Continued)

*Primary Examiner* — David J Makiya
*Assistant Examiner* — Djura Malevic
(74) *Attorney, Agent, or Firm* — Marian E. Fundytus; Amster Rothstein & Ebenstein LLP

(57) ABSTRACT

The present application discloses a method for optical detection of defects on a photosensitive object by fluorescence imaging in the infrared and near-infrared wavelengths of light. The method of fluorescence imaging enables fast and efficient defect detection on the object for quality control. Furthermore, the imaging process does not alter, discolor, or degrade electrical performance of the photosensitive object.

13 Claims, 4 Drawing Sheets

(51) Int. Cl.
  *C09D 11/50* (2014.01)
  *C09D 11/52* (2014.01)
  *G01N 21/88* (2006.01)
  *G01N 21/956* (2006.01)
  *G02B 21/16* (2006.01)

(52) U.S. Cl.
  CPC ....... *G01N 21/8851* (2013.01); *G01N 21/956* (2013.01); *G01N 2021/6471* (2013.01); *G01N 2201/061* (2013.01); *G02B 21/16* (2013.01)

(56) References Cited

U.S. PATENT DOCUMENTS

| | | | |
|---|---|---|---|
| 5,928,571 A | 7/1999 | Chan | |
| 5,968,479 A | 10/1999 | Ito | |
| 6,014,209 A * | 1/2000 | Bishop | G01N 21/9501 356/237.5 |
| 6,427,544 B1 * | 8/2002 | Sanders | G01N 21/91 73/865.8 |
| 6,521,037 B1 * | 2/2003 | Hurt | F23J 1/00 106/DIG. 1 |
| 6,534,041 B1 | 3/2003 | Licha | |
| 6,677,584 B2 * | 1/2004 | Yonushonis | G01N 21/6447 850/6 |
| 6,916,221 B2 * | 7/2005 | Kaltenbach | H10K 71/00 445/3 |
| 6,943,902 B2 * | 9/2005 | Borchardt | G01N 21/91 356/630 |
| 7,495,214 B2 * | 2/2009 | Pan | B41J 29/393 250/302 |
| 7,706,700 B2 * | 4/2010 | Pan | G03G 15/55 399/12 |
| 7,780,377 B2 * | 8/2010 | Brady | E21D 21/0093 405/259.1 |
| 7,850,801 B2 * | 12/2010 | Kobayashi | G01N 21/8422 156/379 |
| 7,893,609 B2 * | 2/2011 | Irie | G01N 21/95 313/506 |
| 8,304,242 B2 * | 11/2012 | Zhang | G01N 21/91 436/5 |
| 8,350,064 B2 | 1/2013 | Strongin | |
| 8,765,942 B2 | 7/2014 | Feraud | |
| 9,310,315 B2 * | 4/2016 | Zhang | C07F 5/022 |
| 11,415,661 B2 * | 8/2022 | Eberspach | G01J 1/0422 |
| 11,614,406 B2 * | 3/2023 | Hobbs, Jr. | H02S 50/15 250/461.1 |
| 11,988,970 B2 * | 5/2024 | Lan | G01N 21/643 |
| 2002/0135758 A1 * | 9/2002 | Potyrailo | G01N 21/8422 356/237.2 |
| 2003/0041774 A1 * | 3/2003 | Auslander | C09D 11/50 106/31.64 |
| 2003/0102797 A1 * | 6/2003 | Kajiwara | C09K 11/642 313/486 |
| 2003/0171059 A1 * | 9/2003 | Kawase | H10K 59/122 445/24 |
| 2004/0207314 A1 * | 10/2004 | Aitken | C03C 3/17 313/504 |
| 2005/0001545 A1 * | 1/2005 | Aitken | H10K 59/8722 313/504 |
| 2005/0195389 A1 * | 9/2005 | Noy | G01N 21/956 356/237.2 |
| 2007/0082288 A1 * | 4/2007 | Wright | B41M 5/46 430/200 |
| 2007/0170860 A1 * | 7/2007 | Choi | H10K 50/8426 313/504 |
| 2008/0054796 A1 * | 3/2008 | Sung | H10K 50/8426 313/504 |
| 2008/0144921 A1 | 6/2008 | Lizotte | |
| 2008/0180026 A1 * | 7/2008 | Kondo | G02B 5/045 313/506 |
| 2008/0182076 A1 * | 7/2008 | Kondo | G02F 1/133606 156/304.1 |
| 2009/0159817 A1 * | 6/2009 | Irie | G01N 21/956 250/474.1 |
| 2009/0288754 A1 * | 11/2009 | Kobayashi | G01N 21/21 156/64 |
| 2010/0011656 A1 * | 1/2010 | Gessner | C09B 5/62 546/37 |
| 2010/0230613 A1 * | 9/2010 | Pieprzyk | G01N 21/05 250/234 |
| 2010/0291685 A1 * | 11/2010 | Zhang | G01N 21/643 436/5 |
| 2011/0211152 A1 * | 9/2011 | Hirabayashi | G03B 21/145 349/158 |
| 2012/0193619 A1 * | 8/2012 | Taka | H10K 50/19 257/40 |
| 2013/0020507 A1 * | 1/2013 | Zhang | G01N 21/91 548/405 |
| 2014/0027751 A1 * | 1/2014 | Furukawa | C09K 11/06 257/40 |
| 2014/0103321 A1 * | 4/2014 | Furukawa | C09D 11/52 257/40 |
| 2014/0173871 A1 * | 6/2014 | Copp-Howland | G01N 21/59 356/402 |
| 2014/0175305 A1 * | 6/2014 | Zhang | G01N 21/91 428/141 |
| 2015/0192529 A1 * | 7/2015 | Sato | G01N 21/4738 356/73 |
| 2016/0146799 A1 * | 5/2016 | Robinson | G01N 33/582 506/13 |
| 2018/0013067 A1 * | 1/2018 | Boehm | C09D 11/10 |
| 2018/0159468 A1 * | 6/2018 | Trupke | G01N 33/00 |
| 2018/0159469 A1 * | 6/2018 | Trupke | H02S 50/15 |
| 2019/0258098 A1 * | 8/2019 | Oba | F21V 9/00 |
| 2020/0032137 A1 * | 1/2020 | Watano | B32B 27/18 |
| 2021/0009518 A1 * | 1/2021 | Tada | H10K 85/615 |
| 2021/0294021 A1 * | 9/2021 | Romero | G02F 1/1335 |
| 2022/0223812 A1 * | 7/2022 | Watabe | H05B 33/02 |
| 2025/0164817 A1 * | 5/2025 | Clark | G02B 30/26 |

FOREIGN PATENT DOCUMENTS

| | | | | |
|---|---|---|---|---|
| JP | S62269048 A | 11/1987 | | |
| JP | 2006329819 A | 12/2006 | | |
| JP | 2007017377 A | 1/2007 | | |
| TW | M577943 U | 5/2019 | | |
| WO | WO-2013167428 A1 * | 11/2013 | ......... | G01N 21/6489 |

OTHER PUBLICATIONS

Written Opinion of the International Searching Authority issued in International Application No. PCT/US2024/012812, mailed Jun. 6, 2024.
International Preliminary Report on Patentability (Chapter II of the Patent Cooperation Treaty) issued in International Application No. PCT/US2024/012812, mailed Jan. 9, 2025.
Ansuini, F. J. & Dimond, J. R., "Factors affecting the accuracy of reference electrodes," Mater. Perform. 33, 14-17 (1994).
Lindfors, T., "Light sensitivity and potential stability of electrically conducting polymers commonly used in solid contact ion-selective electrodes," J. Solid State Electrochem. 13, 77-89 (2009).
Poznyak, S. K. & Kulak, A. I., "Photoelectrochemical properties of bismuth oxyhalide films," Electrochem. Acta 35, 1941-1947 (1990).
Journal of Fluorescence, 25(5), 1403-1415, Tathe, A. B. (2015).
Organic Letters, 17(13), 3306-3309, Barbero, N., et al. (2015).

* cited by examiner

FLUORESCENT INK AND IMAGING SYSTEM FOR DEFECT DETECTION ON PRINTED PHOTOSENSITIVE OBJECTS

CROSS REFERENCE TO RELATED APPLICATIONS

The present application is a § 371 National Phase application based on PCT/US2024/012812 filed Jan. 24, 2024, which claims the benefit of U.S. Provisional Application No. 63,441,198, filed Jan. 26, 2023, the subject matter of each of which is incorporated by reference in their entirety.

FIELD OF THE INVENTION

The present invention is related to detection of print defects on printed objects such as medical devices, electronic devices, electrochemical devices, printed circuits, circuit boards, OLED devices, and the like. Defects are detected using fluorescent imaging systems.

BACKGROUND OF THE INVENTION

Cited references describe fluorescent imaging systems using various fluorescent marked materials which are applied to an object so that the fluorescent mark highlights the presence of defects on the surface of the object. Fast and efficient defect detection of the object thus enables quality control and the identification of any defective objects in a process of production. The object may be, for example, a printed, patterned, or machined surface. Examples of end-use applications include medical devices, electrochemical devices, printed circuits, circuit boards, and OLED devices.

Print defects arise from an imperfect process of printing. Common print defects in the case of screen printing include non-inked spots in printed areas (pinholes), ink spots in non-print areas, and blurred indistinct edges of print areas. Defects in the form of small pinholes or ink spots may be especially difficult to visually detect on the surface of a printed object. Visual detection is especially challenging if the background surface of the object has a variegated light and dark background. Fluorescence imaging of a fluorescent marked ink can highlight defects to overcome this difficulty.

Cited references refer to various fluorescent marked materials, which are applied to an object so that the fluorescent mark on the object provides some needed image contrast that highlights the presence of defects. These combinations of fluorescence imaging systems and fluorescent marked materials are incorporated together into optical inspection systems.

U.S. Pat. No. 6,943,902 refers to a quality control method involving optical inspection. The light source is a tungsten lamp for visible light or a mercury lamp for UV light, and the fluorescent markers respond to light in UV and visible wavelengths.

US 2008/0144921 refers to an inspection method with UV light excitation and suggested fluorescent markers that absorb UV light.

U.S. Pat. No. 6,916,221 describes an inspection method where UV light, preferably 365 nm wavelength, excites the luminescent materials inherent in an OLED display device for defect detection.

TW M577943 discloses a detection system in which UV light in wavelengths 30-380 nm excites fluorescence in glue residue on printed circuit boards.

An especially relevant example, US 2014/0173871, refers to a method of inspecting an object that incorporates a medical electrode material. The medical electrode material contains a fluorescent marker, such as fluorescein sodium. The object is irradiated with UV light or with visible light in the range of about 420 to 480 nm in an otherwise dark environment. The fluorescent object in these conditions is inspected for quality.

JP 2007-017377 refers to a fluorescent flaw detector that excites fluorescent materials with UV light.

U.S. Pat. No. 9,310,315 describes a range of fluorescent materials used to image defects in polymer surfaces.

Fluorescent markers are often used for biological assays. US 2016/0146799 discloses a device and method for enhancing the fluorescent signal of biological molecules in biomedical detection and imaging applications. U.S. Pat. No. 5,928,571 describes thick film compositions for making medical electrodes. U.S. Pat. No. 5,968,479 discloses a diagnostic marker comprising an indocyanine green fluorescent functional group bound to an antibody, where the diagnostic marker is used to bind to tumor cells in living tissue. The indocyanine green derivatives emit fluorescence under excitation with near infrared rays and infrared rays. U.S. Pat. No. 6,534,041 discloses acid-labile and enzymatically divisible dye compounds for in vivo and in vitro diagnosis by means of near infrared radiation (NIR-radiation). U.S. Pat. No. 8,765,942 describes a process for preparing diaminophenothiazinium type fluorescent dye compounds, particularly methylene blue. There is no disclosure of using these fluorophores in printing inks to detect defects in printed objects.

U.S. Pat. No. 5,525,516 discloses a method for tagging petroleum products. Very low levels of infrared fluorophores selected from squaraines, phthalocyanines, and naphthalocyanines are added to petroleum hydrocarbons. The fluorophores emit fluorescence when exposed to near infrared radiation having a wavelength in the 670 to 850 nm range. US 2010/0011656 discloses the use of low levels of rylenes as markers for liquids, particularly mineral oils (petroleum products). The rylenes have maximum absorption in the range from 600 to 1200 nm, and/or fluorescence in the range from 600 to 1200 nm. There is no disclosure of using these fluorophores in printing inks to detect defects in printed objects.

The references cited above for detecting defects in objects all describe fluorescence imaging systems for defect inspection that irradiate an object with either UV light or visible light in wavelengths less than or equal to 480 nm. These references do not address a problem of imaging photosensitive objects, which may discolor, darken, or degrade in performance in the process of inspection when exposed to UV light or visible light in wavelengths less than 480 nm.

A particular problem arises when fluorescent markers and fluorescence imaging systems are applied to some materials used in electrochemical devices. Printed electrode material used in electrochemical devices frequently exhibit photosensitivity. Exposure to UV light or visible light alters the electrode potential and degrades the device performance. Therefore, many of these previously known defect imaging systems and fluorescent markers, which are excited by application of a bright UV or broad spectrum (white) visible light, or by visible light in wavelengths less than 480 nm, also potentially degrade the performance of the electrochemical device.

Several diverse types of electrode materials are known to be photosensitive and prone to degradation in UV or broad-spectrum visible light. See for example: Ansuini, F. J. & Dimond, J. R., "Factors affecting the accuracy of reference electrodes," *Mater. Perform.* 33, 14-17 (1994); Lindfors, T., "Light sensitivity and potential stability of electrically conducting polymers commonly used in solid contact ion-selective electrodes," *J. Solid State Electrochem.* 13, 77-89 (2009); Poznyak, S. K. & Kulak, A. I., "Photoelectrochemical properties of bismuth oxyhalide films," *Electrochem. Acta* 35, 1941-1947 (1990). Important examples of light sensitive electrodes include silver-silver salt electrodes, copper-copper salt electrodes, bismuth oxyhalide electrodes, and conducting polymer electrodes, such as electrodes composed of poly(pyrrole), poly(3-octylthiophene), poly(3,4-ethylenedioxythiophene), poly(aniline) and similar conducting polymers known to have light sensitivity.

The cited references do not address the problem of how to construct a fluorescence imaging system to detect defects of photosensitive objects, such as printed electrochemical devices.

Citation or identification of any document in this application is not an admission that such represents prior art to the present invention.

BRIEF SUMMARY OF THE INVENTION

The present invention provides a method for detecting print defects on the surface of photosensitive objects. The present application describes the construction of a fluorescence imaging system comprising fluorescent markers. Disclosed are defect imaging systems that operate in red or near-infrared wavelengths of excitation light to identify print defects in printed electrochemical devices by optical inspection without damaging light sensitive materials or otherwise impacting electrochemical performance.

In a particular aspect, the present invention provides a method for optical detection of print defects on the surface of a photosensitive printed object using fluorescence imaging, the method comprising the steps of:
(a) providing a substrate;
(b) providing a photosensitive ink that comprises at least one fluorophore as a fluorescent marker that absorbs light at wavelengths equal to or greater than 595 nm, and emits fluorescent light at wavelengths equal to or greater than 650 nm;
(c) printing the photosensitive ink onto a surface of the substrate, to obtain a photosensitive printed substrate;
(d) providing a fluorescence imaging system, wherein the imaging system comprises:
  i. a source of bright excitation light having a wavelength of equal to or greater than 595 nm;
  ii. a camera;
  iii. a lens;
  iv. an optical filter;
  v. image acquisition software;
(e) illuminating the surface of the photosensitive printed substrate with light in a wavelength equal to or greater than 595 nm, wherein the light does not discolor or degrade the performance properties of the photosensitive printed substrate, and eliciting fluorescent emitted light from the fluorescent marker in the ink;
(f) capturing an image of the emitted light from the fluorescent marker in the ink; and
(g) identifying print defects on the surface of the photosensitive substrate, based on the different contrast levels between the fluorescent ink and the background.

In certain embodiments, the photosensitive ink comprises metal/metal salt as a photosensitive material. In some embodiments, the ink comprises silver/silver halide as a photosensitive material.

In certain embodiments, the fluorophore is selected from cyanines; indocyanines; porphyrinoids; porphyrin and porphyrin derivatives; azaporphyrin and azaporphyrin derivatives; phthalocyanines; naphthalocyanines; xanthenes; coumarin and coumarin derivatives; phenothiazines; phenoxazines; phenazines; squaraines, croconic acid derivatives; triphenylmethane dyes; and rylene dyes.

These and other objects, advantages, and features of the invention will become apparent to those persons skilled in the art upon reading the details of the formulations and methods as more fully described below.

DETAILED DESCRIPTION OF THE INVENTION

Figure 1:
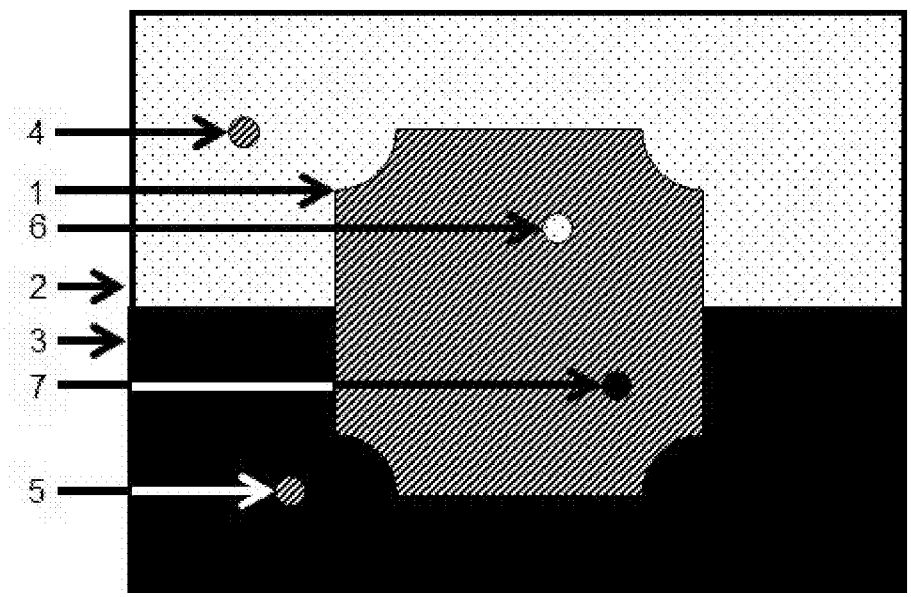
FIG. 1 depicts a printed structure on a surface with some defects, as viewed from above in reflected white light. The printed structure (1) is applied onto a substrate with variegated light (2) and dark (3) background regions. The printing process produces unintended small defects in the form of print dots located in non-print areas (4, 5) and pinholes located in print areas (6, 7). Detection of the print defects is impeded by widely varying visual contrast of defects on light and dark areas of the substrate.
Figure 2:
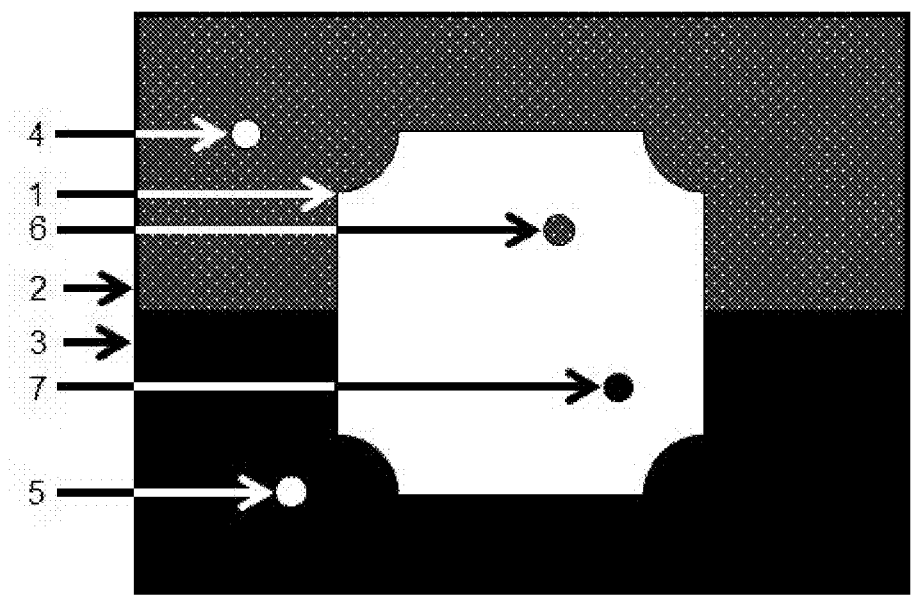
FIG. 2 depicts the same printed structure on a surface with some defects, as viewed from above in a near-infrared fluorescence image. Printed areas, which incorporate a fluorescent marker, appear bright in this image. Detection of the print defects is facilitated in the fluorescence image by higher and more similar image contrast over different background areas.

The present invention application discloses a method for detection of defects by fluorescence imaging on the surface of a photosensitive object, for example a printed electrochemical device. The inventive method of fluorescence imaging avoids damage to photosensitive materials on the surface and does not otherwise alter the electrochemical performance.

It is to be understood that the foregoing general description and the following detailed description are exemplary and explanatory only, and are not restrictive of any subject matter claimed.

Headings are used solely for organizational purposes, and are not intended to limit the invention in any way.

Unless otherwise defined, all technical and scientific terms used herein have the same meaning as is commonly understood by one of skill in the art to which the inventions belong. All patents, patent applications, published applications and publications, websites and other published materials referred to throughout the entire disclosure herein, unless noted otherwise, are incorporated by reference in their entirety for any purpose. Although any methods and materials similar or equivalent to those described herein can be used in the practice or testing of the present invention, the preferred methods are described.

Definitions

In this application, the use of the singular includes the plural unless specifically stated otherwise. As used herein, the singular forms "a," "an" and "the" are intended to include the plural forms as well, unless the context clearly indicates otherwise.

In this application, the use of "or" means "and/or" unless stated otherwise. Also, when it is clear from the context in which it is used, "and" may be interpreted as "or," such as in a list of alternatives where it is not possible for all to be true or present at once.

As used herein, the terms "comprises" and/or "comprising" specify the presence of the stated features, integers, steps, operations, elements, and/or components, but do not preclude the presence or addition of one or more other features, integers, steps, operations, elements, components, and/or groups thereof. Furthermore, to the extent that the terms "includes," "having," "has," "with," "composed," "comprised" or variants thereof are used in either the detailed description or the claims, such terms are intended to be inclusive in a manner similar to the term "comprising."

When the terms "consist of," "consists of," or "consisting of" is used in the body of a claim, the claim term set off with "consist of," "consists of," and/or "consisting of" is limited to the elements recited immediately following "consist of," "consists of" and/or "consisting of," and is closed to unrecited elements related to that particular claim term. The term "combinations thereof", when included in the listing of the recited elements that follow "consist of," "consists of" and/or "consisting of" means a combination of only two or more of the elements recited.

As used herein, ranges and amounts can be expressed as "about" a particular value or range. "About" is intended to also include the exact amount. Hence "about 5 percent" means "about 5 percent" and also "5 percent." "About" means within typical experimental error for the application or purpose intended.

It is to be understood that wherein a numerical range is recited, it includes the end points, all values within that range, and all narrower ranges within that range, whether specifically recited or not.

Throughout this disclosure, all parts and percentages are by weight (wt % or mass % based on the total weight) and all temperatures are in ° C. unless otherwise indicated.

As used herein, "substrate" means any surface or object to which an ink or coating can be applied. Substrates include, but are not limited to, cellulose-based substrates, paper, paperboard, fabric (e.g. cotton), leather, textiles, felt, concrete, masonry, stone, plastic, plastic or polymer film, spun-bond non-woven fabrics (e.g. consisting of polypropylene, polyester, and the like) glass, ceramic, metal, wood, composites, combinations thereof, and the like. Substrates may have one or more layers of metals or metal oxides, or other inorganic materials. Particularly preferred are non-woven substrates.

As used herein, the term "article" or "articles" means a substrate or product of manufacture. Examples of articles include, but are not limited to: substrates such as cellulose-based substrates, paper, paperboard, plastic, plastic or polymer film, glass, ceramic, metal, composites, and the like; and products of manufacture such as publications (e.g. brochures), labels, and packaging materials (e.g. cardboard sheet or corrugated board), containers (e.g. bottles, cans), a polyolefin (e.g. polyethylene or polypropylene), a polyester (e.g. polyethylene terephthalate), a metalized foil (e.g. laminated aluminum foil), metalized polyester, a metal container, and the like.

As used herein, "inks and coatings," "inks," and "coatings" are used interchangeably, and refer to compositions of the invention, or, when specified, compositions found in the prior art (comparative). Inks and coatings typically contain resins, solvent, and, optionally, colorants. Coatings are often thought of as being colorless or clear, while inks typically include a colorant.

The term "ink" refers to printed colorant as used by printers. The term "ink" may include dye-based inks and/or pigment-based inks. Dye-based inks comprise a dye which may be an organic molecule which is soluble in the ink medium. Pigment-based dyes comprise a pigment, which is a solid-colored particle suspended in the ink medium. The particle may comprise a colored mineral, a precipitated dye, a precipitated dye which is attached to a carrier particle, etc. Inks may be dispensed, deposited, sprayed, brushed, stencilled, painted, or otherwise transferred onto a print-receptive surface.

The term "fluorescence marker" or "marker" as used herein refers to a compound with a characteristic fluorescence property when excited by light, which is incorporated into an ink in its liquid state.

The term "printable" refers to a material, for example an ink or a coating composition, that can be applied selectively to form an image on a substrate having a print receptive surface.

The term "silver/silver chloride ink" or "Ag/AgCl ink" refers to a type of photosensitive ink incorporated as an element in a printed electrochemical device. Ag/AgCl inks are conductive.

The term "photosensitive object" as used herein refers to a material that is altered, discolored or degraded by exposure to ultraviolet light or by exposure to bright visible light in wavelengths lower than 595 nm.

The term "electrochemical device" as used herein refers to a printed electrically conductive structure that either produces an electrical signal in response to a chemical reaction or produces a chemical reaction in response to an electrical stimulus.

The term "OLED" as used herein refers to an organic light emitting diode.

A "defect" is a characteristic of an object that diminishes its quality or value or performance in an application or that diminishes its usefulness. The term "defect" as used herein specifically refers to a characteristic observable on the surface of an object in visible light or fluorescent light.

The term "print defect" as used herein refers to a defect caused by an imperfect method of printing an ink on the surface of an object. The most important defects relevant to this invention are ink spot defects occurring in non-print areas, or pinhole defects occurring in print areas, which are common defects in the process of screen printing.

The term "UV light" as used herein refers to light in a range of wavelengths 100 nm-400 nm.

The term "visible light" as used herein refers to light in a range of wavelengths 400 nm-700 nm.

The term "near-infrared" or "near-IR" or "IR" as used herein refers to light in a range of wavelengths 700 nm-1000 nm.

The term "excitation light" refers to a bright high intensity light at a wavelength that irradiates the surface of an object, capable of exciting fluorescence in a fluorescent material. A fluorescent material absorbs excitation light at some wavelength and then emits some portion of light at a wavelength higher than the excitation light.

The term "metal" refers primarily to silver existing in a completely reduced form with no atomic charge; however, other metals may also find application in a printed photosensitive object, such as gold, copper, iron, bismuth, or others. The metal is typically dispersed in ink in the form of microscopic flakes and/or metal particles and/or metal nanostructures.

The term "metal salt" refers to a chemical compound in which the metal exists in an oxidized form with a positive atomic charge in combination with another substance with balancing negative charge.

The term "halide" can refer to any of these anions: fluoride; chloride; bromide; iodide.

The term "OD" refers to optical density of an optical filter.

The term "long pass" (abbreviated LP) refers to an optical filter transparent to light above a cut-off wavelength. It is opaque to light below the cut-off wavelength.

Materials and Methods for Detection of Surface Defects

The present application discloses a method for detection of defects by fluorescence imaging on the surface of a photosensitive object, for example a printed electrochemical device. The inventive method of fluorescence imaging avoids damage to photosensitive materials on the surface and does not otherwise alter the electrochemical performance.

In the prior art, only reflective mode imaging is used for print defect detection. Reflective imaging has a limitation in distinguishing the layers of similar color at reasonable contrast resolution. Typical wavelengths used in reflective mode imaging are often harmful to photosensitive materials. The use of longer wavelength fluorescent dyes for optical inspection and differentiation of photosensitive functional layers with the same color is not in the prior art, and the present invention is the first time that this has been done. Although fluorophores for longer wavelengths are available, they are not currently being used in detection of printing defects for photosensitive materials. Detection systems for IR exist in biological microscopy, however, the combination of IR detection and IR fluorescent dye in ink with electrical and electrochemical functionality was not used before with the purpose to detect print defects and recognition of inks of the same color.

Applicants observed unexpectedly that illumination of a screen-printed silver-silver chloride electrode material by light with wavelengths less than 595 nm causes immediate visible darkening of the silver-silver chloride surface. Silver-silver chloride ink is a common electrode material in printed electrochemical devices. Silver chloride and other silver halides are known to be sensitive to certain wavelength ranges of UV and visible light. Silver chloride is mainly sensitive to UV light and visible light with wavelengths below about 400 nm. Silver bromide is sensitive to UV light and visible light with wavelengths less than about 490 nm. Silver iodide is sensitive to UV light and visible light with wavelengths less than about 520 nm.

The photochemical degradation of these silver salts in a silver-silver salt electrode causes darkening of the electrode material and may also cause changes in conductivity and electrochemical response of the electrode material. These changes are undesirable for the function of the electrochemical device. Applicants determined that these unwanted changes can be avoided by using illumination with wavelengths greater than 595 nm. The present invention is the first instance of combining the silver/silver chloride inks and IR fluorophores for printing and detection of print defects on photosensitive objects.

The method of the present invention uses long wavelength visible or IR light and IR fluorescent dyes that allows one to distinguish ink layers of the same color from one another. The color observed under visible light of an IR fluorescent dye may appear to be the same as the color of a non-fluorescent dye or pigment. When irradiated with long wavelength visible or IR light and viewed through an appropriate optical filter, the non-fluorescent dye or pigment absorbs the light and appears dark, while the areas printed with the IR fluorescent dyes appear bright due to the fluorescent emission of the IR fluorescent dye.

The electrochemical device ink is applied to the surface by a process of printing of a photosensitive electrochemical ink. In one embodiment, the print process is performed by screen printing or rotary screen printing. The printing process might also be some other type of printing, such as for example gravure, flexographic, thermal transfer, offset, or inkjet printing. Methods of stenciling, brushing, or painting could also be used to apply the ink.

The composition of the electrochemical ink may be similar to materials described in U.S. Pat. No. 5,928,571. A typical composition might contain 20-90 weight percent of finely divided particles of silver, 0-75 weight percent of finely divided particles of silver chloride; 0.25-10 weight percent of a hydrophilic polymer, and 2-15 weight percent of a hydrophobic thermoplastic polymer.

A fluorescent material is incorporated into the electrochemical ink in an amount of less than or equal to 1 weight percent, based on the total weight of the ink. For example, the fluorescent material may be incorporated into the electrochemical ink in an amount of about 0.01 wt % to about 1 wt %, based on the total weight of the ink. The amount of fluorescent material incorporated into the ink is preferably greater than 0.06 wt %, most preferably 0.10 wt % to 0.35 wt %, or 0.15 wt % to 0.30 wt %, or 0.20 wt % to 0.30 wt %. This fluorescent material may be incorporated by any process of mixing, stirring, grinding, or milling sufficient to disperse the material.

Furthermore, applicants evaluated several different fluorescent materials and identified preferred fluorescent materials that absorb light in an illumination wavelength range greater than 595 nm and that emit fluorescent light in wavelengths greater than 650 nm. Fluorescent marker materials suitable for the application must fluoresce brightly when incorporated into the photosensitive electrode material, and the fluorescent marker materials must not alter the electrochemical, optical, or other functional properties of the material.

A fluorescent material is incorporated into the electrochemical ink in an amount of less than 1 weight percent. This fluorescent material may be incorporated by any process of mixing, stirring, grinding, or milling sufficient to disperse the material.

Fluorescent materials considered for use in this electrochemical ink may include any of those that absorb light at wavelengths greater than 595 nm and also emit fluorescent light in wavelengths greater than 650 nm. Examples include, but are not limited to, cyanines, indocyanines, porphyrinoids, porphyrin derivatives and azaporphyrin derivatives, phthalocyanines, naphthalocyanines, xanthenes (including rhodamine derivatives and fluorescein derivatives), coumarin derivatives, phenothiazines, phenoxazines, phenazines, squaraines, croconic acid derivatives, triphenylmethane dyes, and rylene dyes. In some embodiments, the fluorescent marker is a phthalocyanine. In some embodiments, the fluorescent marker is a rylene.

In some embodiments, the fluorescent marker comprises a cyanine or indocyanine. Examples of cyanines include, but are not limited to the following: Cy5.5, Cy5 and Cy7 (Amersham, Arlington Hts., IL); IRD41 and IRD700 (LI-COR, Lincoln, Nebr.); NIR-1, (Dejindo, Kumamoto, Japan); LaJolla Blue (Diatron, Miami, Fla.); indocyanine green (ICG) and its analogs (U.S. Pat. No. 5,968,479, incorporated by reference in its entirety); indotricarbocyanine (U.S. Pat. No. 6,534,041, which is incorporated by reference in its entirety); cardiogreen, and 1,1'-diethyl-4,4'-carbocyanine iodide.

In some embodiments, the fluorescent marker comprises a porphyrinoid or phthalocyanine. Examples of porphyrinoids and phthalocyanines include, but are not limited to compounds described in Lang, K. (2004). Coordination Chemistry Reviews, 248 (3-4), 321-350, such as: aluminum phthalocyanine, sulfonated aluminium phthalocyanine, 5,10-bis(N-methylpyridinium-4-yl)-15,20-bis(phenyl)porphyrin; 5,15-bis($\alpha$-triphenylphosphonium-4-tolyl)-10,20-bis(4-tolyl)porphyrin; hematoporphyrin; magnesium tetrakis(4-tert-butyl)phthalocyanine; magnesium tetrabenzoporphyrin; 5-(N-methylpyridinium-4-yl)-10,15,20-tris(phenyl)porphyrin; sulfonated metal-free phthalocyanine; palladium(II) 5,10,15,20-tetrakis(pentan-3-yl)porphyrin; palladium(H) 5,10,15,20-tetrakis(N-methylpyridinium-X-yl)porphyrin, X=2, 3 and 4; palladium(II) 5,10,15,20-tetraphenylporphyrin; palladium(II) 5,10,15,20-tetrakis(4-sulfonatophenyl)porphyrin; porphycene; protoporphyrin IX; 5,10,15,20-tetrakis($\alpha$-trimethylphosphonium-4-tolyl)porphyrin; 5,10,15,20-tetrakis(N-methylpyridinium-4-yl)porphyrin; 5,10,15,20-tetrakis(3,5-di-tert-butylphenyl)porphyrin; 5,10,15,20-tetrakis(4-carboxyphenyl)porphyrin; TPPP; 5,10,15,20-tetrakis(4-phosphonatophenyl)porphyrin; 5,10,15,20-tetrakis(4-sulfonatophenyl)porphyrin; 5,10,15-tris($\alpha$-triphenylphosphonium-4-tolyl)-20-(4-tolyl)-porphyrin; 2,7,12,17-tetra-n-propyl-porphycene; 5,10,15-tris(N-methylpyridinium-4-yl)-20-(phenyl)porphyrin; 5,10,15,20-tetrakis(4-tolyl)porphyrin; uroporphyrin I; zinc phthalocyanine; zinc tetrahydroxyphthalocyanine; sulfonated zinc phthalocyanine; zinc tetrabenzoporphyrin; zinc 5,10,15,20-tetrakis(2,6-dichloro-3-sulfonatophenyl)porphyrin; zinc 5,10,15,20-tetrakis(N-methylpyridinium-4-yl)porphyrin; zinc 5,10,15,20-tetrakis(4-sulfonatophenyl)porphyrin.

In some embodiments, the fluorescent marker comprises metal-substituted fluorescent phthalocyanines. Examples of metal-substituted phthalocyanines include, but are not limited to, aluminum phthalocyanines, zinc phthalocyanines, magnesium phthalocyanines, silicon phthalocyanines, and any fluorescent phthalocyanines substituted with the elements gallium, germanium, cadmium, scandium, or tin. In some embodiments, the fluorescent probe comprises fluorescent phthalocyanine substituted with the element phosphorus. In some embodiments, the phthalocyanine macrocycle is derivatized with solubilizing substituents such as sulfonic acid, phosphate, phosphonate, hydroxy, phenoxy, thiophenyl, amino, ammonium, or pyridinium groups.

In some embodiments, the fluorescent marker comprises an azaporphyrin derivatives, such as mono-, di- and triazaporphyrin and porphyrazine. Azaporphyrin derivatives may include, for example, phthalocyanine, benzotriazaporphyrin and naphthalocyanine derivatives. The preparation and fluorescent qualities of these dyes are known and many of these compounds are commercially available. These dye compounds act as multidentate macrocyclic ligands to chelate a central complexing atom. In some embodiments, the azaporphyrin fluorescent probe comprises a substantially planar multidentate macrocyclic ligand coordinated to a complexing central ion or atom, such as aluminum, phosphorous, and the group IVB elements, e.g. silicon, germanium and tin.

In some embodiments, the fluorescent marker comprises a xanthene, such as those described in U.S. Pat. No. 8,350,064, which is incorporated by reference in its entirety. Examples xanthene are rhodamines, such as tetramethylrhodamine, Rhodamine B, sulforhodamines, Texas Red, Rhodamine 101, Rhodamine 19, Rhodamine 110, and Carboxyrhodamine 6G. Other examples of xanthenes include, but are not limited to, eosin, carboxyfluorescein, erythrosine, and Rose Bengal.

In some embodiments, the fluorescent marker comprises a phenothiazine, such as thionine, Methylene Blue, Methylene Green, Methylene Violet, and compounds described in U.S. Pat. No. 8,765,942, which is incorporated by reference in its entirety.

In some embodiments, the fluorescent marker comprises a phenoxazine, such as litmus, Nile Blue, and Nile Red, and Basic Blue 3.

In some embodiments, the fluorescent marker comprises a phenazine, such as those described in Journal of Fluorescence, 25(5), 1403-1415, Tathe, A. B. (2015). An example of phenazine is toluylene red.

In some embodiments, the fluorescent marker comprises a squaraine or croconic acid, such as those described in Organic Letters, 17 (13), 3306-3309, Barbero, N., et al. (2015) and U.S. Pat. No. 5,525,516, which is incorporated by reference in its entirety.

In some embodiments, the fluorescent marker comprises a triphenylmethane dye, such as FD&C Blue 1, FD&C Green 3, Brilliant Green, Crystal Violet, Ethyl Violet, Victoria Blue R, Victoria Pure Blue BO, Victoria Blue B, and the like.

In some embodiments, the fluorescent marker comprises a rylene dye, such as perylene, terrylene, quarterrylene, and other poly(peri-naphthalene) s and their derivatives, also perylene diimide derivatives, and compounds described as markers for liquids in US20100011656, which is incorporated by reference in its entirety.

Figure 3:
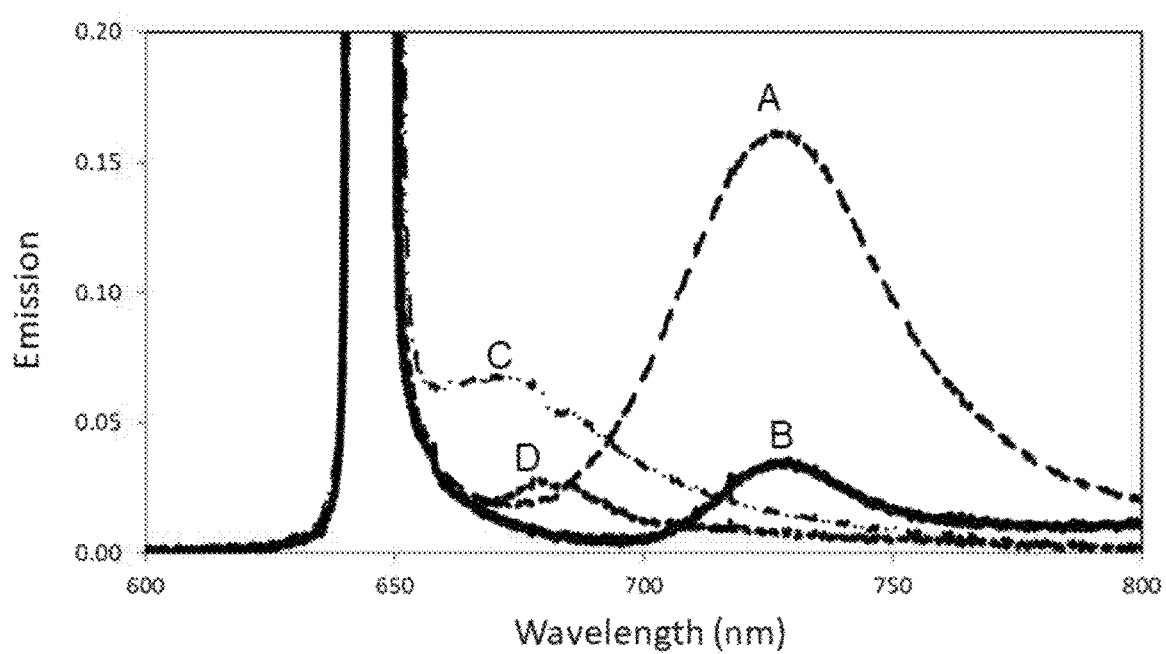
FIG. 3 depicts fluorescence emission spectra of four Ag/AgCl inks containing four different fluorescent markers (A-D) printed on a substrate. The excitation wavelength is 635 nm. Each of the markers emits fluorescent light in wavelengths above 650 nm.
Figure 4:
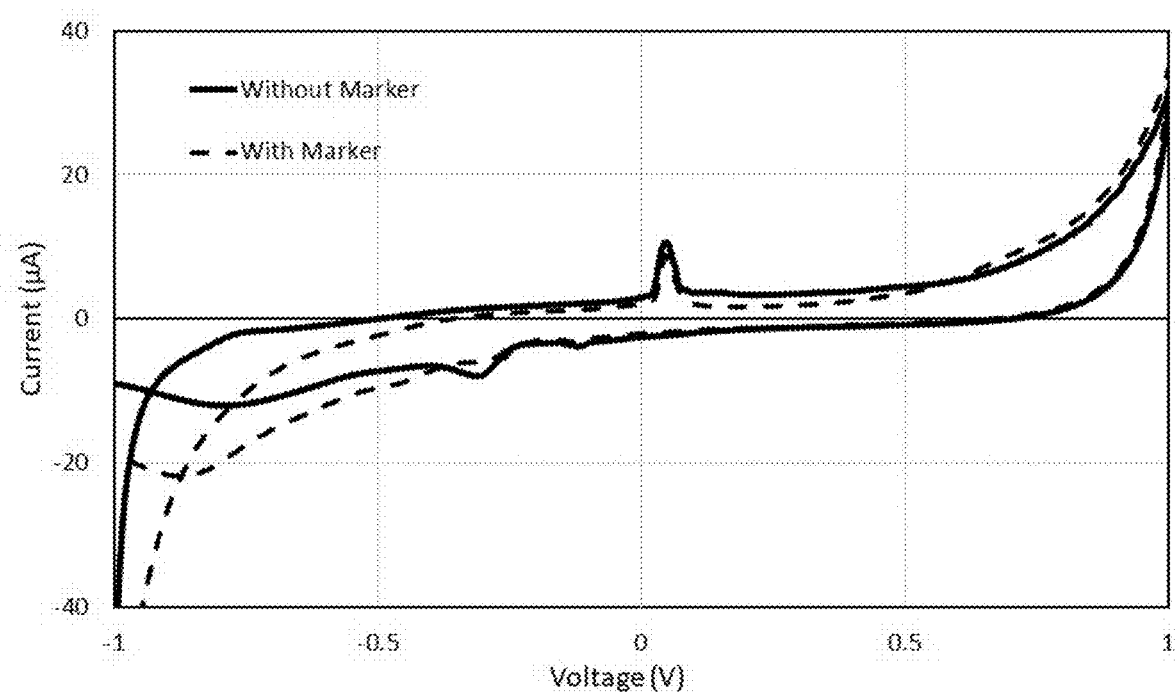
FIG. 4 depicts overlayed cyclic voltammograms of an electrochemical device, which was printed using a Ag/AgCl ink. The solid trace characterizes electrochemical performance of ink without a fluorescent marker. The dashed trace characterizes performance of ink incorporating Fluorescent Marker 1 of Example 1.

Representative emission spectra of four fluorescent markers dispersed in Ag/AgCl ink are shown in FIG. 3. The markers were irradiated with 635 nm excitation light, and they each emit fluorescent light in a range of wavelengths above 650 nm. Furthermore, FIG. 4 shows the cyclic voltammogram of a printed electrochemical device. Incorporation of a fluorescent marker into the electrochemical ink does not adversely affect the electrochemical performance of the device.

Fluorescent markers for use in this invention could also be incorporated into an ink in combination with silver nanostructures or other metal nanostructures dispersed in ink, such that the fluorescence of the marker is enhanced in proximity to the metal nanostructures in the printed ink film.

US20160146799 describes enhanced fluorescence imaging in films containing silver or gold nanostructures in combination with fluorescent markers, such as preferably near-infrared fluorescent markers, IR680 or IR800.

EXAMPLES

The present invention is further described by the following non-limiting examples, which further illustrate the invention, and are not intended to, nor should they be interpreted to, limit the scope of the invention.

Example 1. Preparation of a Fluorescent Marked Silver/Silver Chloride (Ag/AgCl) Ink Fluorescent Marker 1 was added to a Ag/AgCl ink by stirring to produce a screen-printable ink with the composition as shown in Table 1. The ingredients, apart from Fluorescent Marker 1, were blended together by a process of three-roll milling. The polymeric binder contains a vinyl resin. The solvent is a glycol ether.

TABLE 1

Example 1 Fluorescent marked Ag/AgCl ink

| Materials | Ex. 1 (Wt. %) |
|---|---|
| Silver Particles | 47.68 |
| Silver Chloride | 31.79 |
| Polymeric Binder | 8.75 |
| Solvent | 11.53 |
| ¹Fluorescent Marker 1 | 0.25 |
| Total | 100.00 |

¹Fluorescent Marker 1 is a perylene pigment with near-infrared fluorescence.

The ink of Example 1 was hand screen printed through a stainless steel 230 mesh screen with a test pattern from NBC Meshtec. The substrate was a Form 3B Leneta Opacity Chart with white and black backgrounds over a paper board. The proof was dried in a 70° C. oven to remove the solvent. The dried proof was stored in the dark to protect it from ambient room light exposure.

Portions of the proof of Example 1 were irradiated with bright light of several wavelengths emitted from LEDs. Exposure duration was one minute within a 1 mm diameter spot. The irradiated areas of the proof were then imaged under an optical microscope, and color changes on the surface of the prints were measured for the following irradiation wavelengths: 365 nm, 385 nm, 455 nm, and 595 nm wavelengths. Discoloration of the proof surface quickly occurs when irradiated with UV light at 365 nm. Discoloration also occurs when irradiated with visible blue and green light at 385 and 455 nm; however, visible orange light at 595 nm does not discolor the print. These results substantiate that fluorescent imaging with irradiation wavelengths 595 and higher does not discolor the photosensitive electrode material.

This discoloration of irradiated ink proofs is recorded in Table 2 below, wherein the discoloration was measured by recording the change in grayscale value (Δ grayscale) before and after light exposure. Grayscale values in digital black-and-white images have values ranging from 0 (zero) for black up to 255 for white. Negative Δ grayscale values indicate darkening of the surface due to light exposure. Significant visually perceptible darkening was observed and measured for exposure wavelengths less than 595 nm. Values for Δ grayscale ≤−10 (e.g. −20, −30, etc.) represents "significant darkening."

TABLE 2

Discoloration of a printed photosensitive object due to light exposures

| Exposure Wavelength (nm) | Δ Grayscale |
|---|---|
| 365 | −80 |
| 385 | −50 |
| 455 | −30 |
| 595 | Visually imperceptible darkening (−6) |

A fluorescence emission spectrum of the proof of Example 1 was obtained (FIG. 3A.) The emission peak of Marker 1 appears at approximately 730 nm. Furthermore, irradiation of the proof with the bright excitation light at 635 nm did not cause any discoloration or degradation of the Ag/AgCl ink during the fluorescence measurement.

Fluorescence emission spectra were obtained using a fiber spectrometer from Thorlabs. The excitation source was a 635 nm Diode Laser #UHS-10G-635-SMA from Thorlabs. A RG-665 nm #45-065 cut-off filter from Edmund optics was used to filter reflected excitation light from the proof surface through an optical fiber #R400-7-VIS/NIR. The spectrum was acquired with a Thorlabs Compact Spectrometer CCS200.

Example 2. Preparation of a Printed Electrochemical Device

A printed electrochemical device was made in which one electrode of the device incorporated a printed Ag/AgCl ink on a surface. The identical device was made with composition similar to Example 1 either with or without incorporation of the Marker 1, i.e. a device printed with the Ag/AgCl ink without Fluorescent Marker 1, and a second device prepared in the same manner, except that Fluorescent Marker 1 was added to the ink.

The electrochemical performance of devices with and without added marker were evaluated by cyclic voltammetry. The resulting voltammograms are shown overlaid in FIG. 4 for the unmarked and marked ink. The results show no change in electrochemical performance due to the addition of the marker in the region of interest versus the performance of the unmarked ink. The addition of the fluorescent marker does not alter the performance of the device.

Cyclic voltammetry was performed in a buffer solution containing 0.1M PBS and 0.1M KCl at pH 7.5. The starting voltage was −1.0 V. The ending voltage was +1.0 V with voltage step of 0.01 V and a scan rate of 1.0 V/s.

Example 3. Construction of a Fluorescence Imaging System

Figure 5:
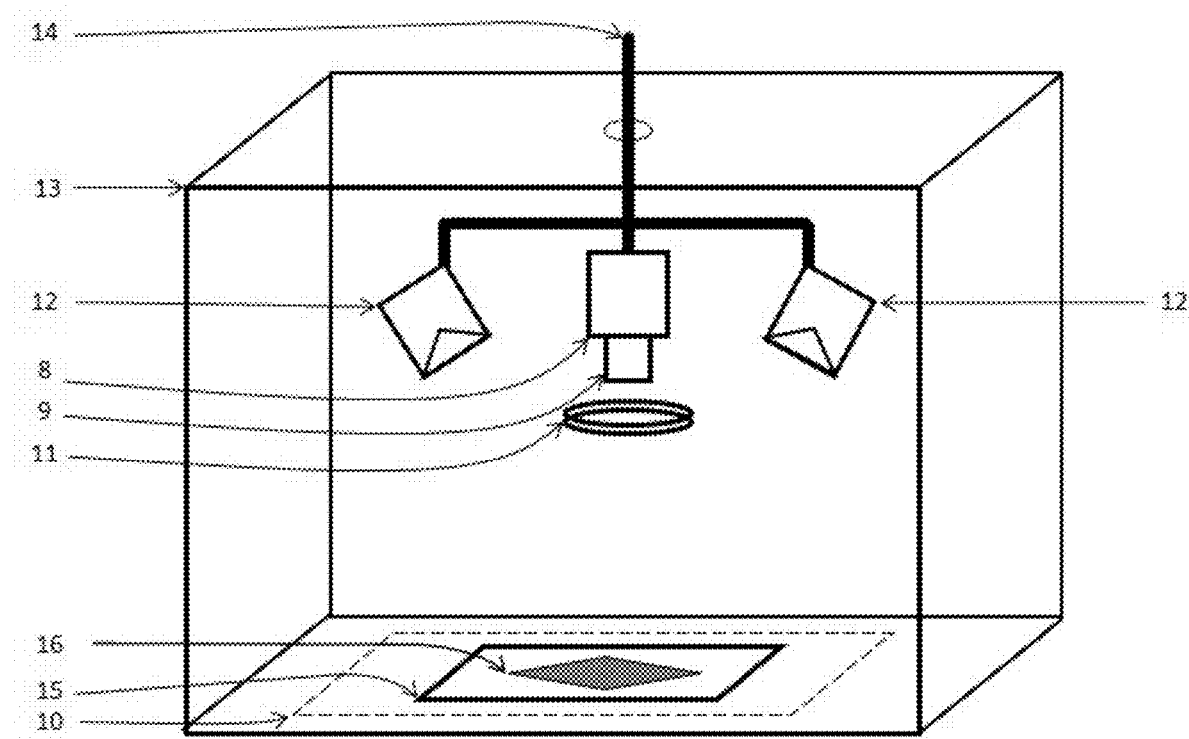
FIG. 5 depicts a schematic drawing of a fluorescence imaging system. The elements of this imaging system include (8) a camera, (9) a lens that focuses light onto (10) an imaging plane, (11) an optical filter, (12) excitation light, (13) a dark enclosure that shields the imaging system from exterior light, and (14) connections to image acquisition software. A photosensitive object (15) with a fluorescent marked printed structure on its surface (16) is located at the imaging plane.

A fluorescence imaging system was constructed with characteristics broadly identified in the schematic depiction of FIG. 5. Excitation light was provided by two 625 nm strobe lights from Smart Vision Lights mounted to either side of a camera, aimed downward at approximately 45° to uniformly illuminate an area of a printed surface located about 4 cm below the camera and strobes. The camera was a Microscan Visionscape GigE Type CMG03. An 8 mm lens was mounted on the camera. The lens aperture was opened fully. An optical long pass filter was mounted on the front of the lens. A photosensitive object with a fluorescent marked printed structure on its surface was positioned at the imaging plane in view of the camera. Images were acquired using Visionscape Frontrunner Software. Image acquisition was triggered by the strobe light activation. Image acquisition time was set to 250 µsec. Analog gain of the camera sensor was set in the software to optimize contrast in fluorescence images.

Applicants tested and optimized the fluorescence imaging system by making simulated print defects on printed surfaces. We dipped the end of a fine wire into the ink of Example 1 and manually applied small drops of ink to the surface. Prints with simulated defects were dried in a 70° C. oven.

Fluorescence images were acquired using several different optical filters to identify best image contrast of fluorescent defect spots over white and black backgrounds. Image contrast was measured as the difference in grayscale value of the print defect versus the background. Contrast was measured over both black and white backgrounds. The contrast values are summarized in Table 3. Contrast values acquired in the fluorescence image were also compared to contrast of the brightfield reflected light image under an optical microscope.

TABLE 3

Image contrast obtained using different optical filters

| Optical Filter | Contrast on White Background | Contrast on Black Background |
| --- | --- | --- |
| 665 nm LP, OD 4 | −41 | +43 |
| 700 nm LP, OD 4 | +107 | +186 |
| 735 nm LP, OD 4 | +95 | +110 |
| 750 nm LP, OD 2 | +193 | +234 |
| Optical Microscope | −91 | +132 |

The analog gain was 5.0, and the digital gain was set to 2.5 for all fluorescence images. Grayscale values in digital black-and-white images have values ranging from 0 (zero) for black up to 255 for white. Positive contrast values indicate the print defect appears brighter (whiter) than the background. Negative values indicate the print defect appears darker than the background. Best image contrast is obtained when the print defect has a high positive contrast value, regardless of the background. "High positive contrast value" is here defined as >80.

Simulated print defects in the optical microscope image (without fluorescence imaging) have highly variable image contrast, which is positive on a black background and negative on a white background; therefore, the defect is not easily identified in reflected visible light on a variegated background print surface.

Simulated defects in fluorescence images have improved image contrast when using a 700 nm or higher wavelength long pass filter. Contrast values are positive over black or white backgrounds; therefore, fluorescence imaging with 700 nm or higher wavelength long pass filters can more easily identify fluorescent-marked defects on a variegated background print. The 750 nm LP OD 2 filter is our preferred best condition for imaging defects of the ink of Example 1 on either black or white backgrounds.

Examples 4 and 5. Preparation of Fluorescent Ag/AgCl Inks with Different Marker Levels Fluorescent Marker 1 was added at different levels to Ag/AgCl ink to produce screen printable inks with compositions as shown in Table 4.

TABLE 4

Examples 4 and 5 - fluorescent marked Ag/AgCl inks

| Materials | Ex. 4 (Wt. %) | Ex. 5 (Wt. %) |
| --- | --- | --- |
| Silver Particles | 47.68 | 47.68 |
| Silver Chloride | 31.79 | 31.79 |
| Polymeric Binder | 8.75 | 8.75 |
| Solvent | 11.65 | 11.72 |
| Fluorescent Marker 1 | 0.13 | 0.06 |
| Total | 100 | 100 |

Inks of Examples 1, 4, and 5 were hand screen printed through a stainless steel 230 mesh screen with a test pattern from NBC Meshtec onto Form 3B Leneta Opacity Charts. The proofs were dried in a 70° C. oven to remove the solvent. The dried proofs were stored in the dark to protect them from ambient room light exposure. The fluorescence imaging system of Example 3 with a 750 nm OD 2 LP filter was used to acquire fluorescence images of the prints. Image contrast over white and black backgrounds is summarized in Table 5.

TABLE 5

Image contrast of inks with different fluorescent Marker levels

| | Marker (wt. %) | Contrast on White Background | Contrast on Black Background |
| --- | --- | --- | --- |
| Example 1 | 0.25 | +134 | +205 |
| Example 4 | 0.13 | +40 | +111 |
| Example 5 | 0.06 | +10 | +81 |

The diminished levels of fluorescent marker in Examples 4 and 5 produce lower contrast images versus Example 1. The ink of Example 5 has adequate contrast on a black background but minimal contrast on a white background and thus would be a less preferred embodiment, though still fit for use in some applications. As indicated by the results in Table 5, the preferred concentration of Marker 1 in this ink is greater than 0.06%, most preferably 0.10-0.35%, or 0.15-0.30%, or 0.20-0.30%.

Examples 6 to 8. Preparation of Fluorescent Ag/AgCl Inks with Different Markers

Several other fluorescent markers were also added to a Ag/AgCl ink to produce screen-printable ink compositions as shown in Table 6.

TABLE 6

Examples 6 to 8 Ag/AgCl inks

| Materials | Ex. 6 (Wt. %) | Ex. 7 (Wt. %) | Ex. 8 (Wt. %) |
| --- | --- | --- | --- |
| Silver Particles | 47.68 | 47.68 | 47.68 |
| Silver Chloride | 31.79 | 31.79 | 31.79 |
| Polymeric Binder | 8.75 | 8.75 | 8.75 |
| Solvent | 11.53 | 11.53 | 11.53 |
| [2]Fluorescent Marker 2 | 0.25 | — | — |

TABLE 6-continued

Examples 6 to 8 Ag/AgCl inks

| Materials | Ex. 6 (Wt. %) | Ex. 7 (Wt. %) | Ex. 8 (Wt. %) |
|---|---|---|---|
| [3]Fluorescent Marker 3 | — | 0.25 | |
| [4]Fluorescent Marker 4 | — | — | 0.25 |
| Total | 100.00 | 100.00 | 100.00 |

[2]Fluorescent Marker 2 is a phthalocyanine pigment with near-infrared fluorescence.
[3]Fluorescent Marker 3 is a perylene pigment with near-infrared fluorescence.
[4]Fluorescent Marker 4 is a phthalocyanine pigment with near-infrared fluorescence.

Example 6-8 inks were hand screen printed through a stainless steel 230 mesh screen with a test pattern from NBC Meshtec onto Form 3B Leneta Opacity Charts. The proofs were dried in a 70° C. oven to remove the solvent. The dried proofs were stored in the dark to protect them from ambient room light exposure. Fluorescence emission spectra of the proofs were obtained (see FIG. 3, traces B to D) using the fiber spectrometer. Trace A in FIG. 3 is the emission spectrum of a proof of the ink of Example 1, described above. The emission peak of Marker 2 (trace B) appears at approximately 675 nm. The peak of Marker 3 (trace C) appears at approximately 730 nm. The peak of Marker 4 (trace D) appears at approximately 680 nm. Each of these alternative fluorescent markers could also be used to implement this invention. They each absorb light at wavelengths greater than 595 nm and emit fluorescent light at wavelengths greater than 650 nm.

The present invention has been described in detail, including the preferred embodiments thereof. However, it will be appreciated that those skilled in the art, upon consideration of the present disclosure, may make modifications and/or improvements on this invention that fall within the scope and spirit of the invention.

What is claimed is:

1. A method for optical detection of print defects on the surface of a photosensitive printed electrochemical device using fluorescence imaging, the method comprising the steps of:
   (a) providing a substrate;
   (b) providing a photosensitive electrochemical ink that comprises at least one fluorophore as a fluorescent marker that absorbs light at wavelengths equal to or greater than 595 nm, and emits fluorescent light at wavelengths equal to or greater than 650 nm; and metal/metal salt as a photosensitive material; wherein incorporation of the fluorophore in the ink does not adversely affect the electrochemical performance of the electrochemical device;
   (c) printing the photosensitive ink onto a surface of the substrate, to obtain a photosensitive printed substrate;
   (d) providing a fluorescence imaging system, wherein the imaging system comprises:
      i. a source of bright excitation light having a wavelength of equal to or greater than 595 nm;
      ii. a camera;
      iii. a lens;
      iv. an optical filter;
      v. image acquisition software;
   (e) illuminating the surface of the photosensitive printed substrate with light in a wavelength equal to or greater than 595 nm, wherein the light does not discolor or degrade the performance properties of the photosensitive printed substrate, and eliciting fluorescent emitted light from the fluorescent marker in the ink;
   (f) capturing an image of the emitted light from the fluorescent marker in the ink; and
   (g) identifying print defects on the surface of the photosensitive substrate, based on the different contrast levels between the fluorescent ink and the background.

2. The method of claim 1, wherein the metal/metal salt in the photosensitive ink is selected from the group consisting of silver/silver salt, gold/gold salt, copper/copper salt, iron/iron salt, and bismuth/bismuth salt.

3. The method of claim 2, wherein the ink comprises silver/silver halide as a photosensitive material.

4. The method of claim 1, wherein the fluorophore is selected from cyanines; indocyanines; porphyrinoids; porphyrin and porphyrin derivatives; azaporphyrin and azaporphyrin derivatives; phthalocyanines; naphthalocyanines; xanthenes; coumarin and coumarin derivatives; phenothiazines; phenoxazines; phenazines; squaraines, croconic acid derivatives; triphenylmethane dyes; and rylene dyes.

5. The method of claim 4, wherein the xanthenes are selected from rhodamine and rhodamine derivatives; and fluorescein and fluorescein derivatives.

6. The method of claim 1, wherein the fluorophore is present in the ink in an amount of 0.01 wt % to 1 wt %, based on the total weight of the ink.

7. The method of claim 1, wherein the fluorophore is present in the ink in an amount of 0.1 wt % to 0.35 wt %, based on the total weight of the ink.

8. The method of claim 1, wherein the optical filter is a long pass filter with a cut-off wavelength greater than the wavelength of the excitation light, but less than the wavelength of the fluorescence emission.

9. The method of claim 1, wherein the illumination is from one or more strobe lights, and the fluorescence image acquisition is triggered by the activation of at least one of the one or more strobe lights.

10. The method of claim 1, wherein the photosensitive ink is applied by a method selected from the group consisting of screen printing, rotary screen printing, flexography, gravure, inkjet, stencil, brush coating, painting, and dip coating.

11. The method of claim 1, wherein the fluorescent marker in the photosensitive ink emits fluorescent light at wavelengths at equal to or greater than 675 nm.

12. The method of claim 1, wherein the fluorescent marker in the photosensitive ink emits fluorescent light at wavelengths at equal to or greater than 700 nm.

13. The method of claim 1, wherein a photosensitive ink printed on the substrate has the same color as an ink having a non-fluorescent dye pigment printed on the substrate when viewed under visible light; and, when irradiated with long wavelength visible or IR light the non-fluorescent dye or pigment absorbs the light and appears dark, while the areas printed with the IR fluorescent dyes appear bright due to the fluorescent emission of the IR fluorescent dye.

* * * * *